(12) United States Patent
Liu et al.

(10) Patent No.: US 11,758,786 B2
(45) Date of Patent: Sep. 12, 2023

(54) ARRAY SUBSTRATE, FABRICATING METHOD THEREFOR AND DISPLAY PANEL

(71) Applicant: BOE Technology Group Co., Ltd., Beijing (CN)

(72) Inventors: Li Liu, Beijing (CN); Pengcheng Lu, Beijing (CN); Rongrong Shi, Beijing (CN); Yuanlan Tian, Beijing (CN); Junbo Wei, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 166 days.

(21) Appl. No.: 17/259,729

(22) PCT Filed: Mar. 18, 2020

(86) PCT No.: PCT/CN2020/079876
§ 371 (c)(1),
(2) Date: Jan. 12, 2021

(87) PCT Pub. No.: WO2021/184235
PCT Pub. Date: Sep. 23, 2021

(65) Prior Publication Data
US 2022/0140018 A1    May 5, 2022

(51) Int. Cl.
*H01L 27/32*   (2006.01)
*H01L 51/56*   (2006.01)
(Continued)

(52) U.S. Cl.
CPC ......... *H10K 59/353* (2023.02); *H10K 50/818* (2023.02); *H10K 50/852* (2023.02);
(Continued)

(58) Field of Classification Search
CPC ... H01L 51/5206–5218; H01L 51/5265; H01L 51/5271; H01L 27/3246;
(Continued)

(56) References Cited

U.S. PATENT DOCUMENTS

| 8,513,882 B2 * | 8/2013 | Kinoshita | ........... H01L 51/5265 313/506 |
| 2004/0090175 A1 * | 5/2004 | Urabe | ................. H01L 27/3246 445/24 |

(Continued)

FOREIGN PATENT DOCUMENTS

| CN | 101661951 A | 3/2010 |
| CN | 104733471 A | 6/2015 |

(Continued)

OTHER PUBLICATIONS

Machine translation, Seki, Korean Pat. Pub. No. KR2012-0139799A, translation date: Aug. 17, 2022, Espacenet, all pages. (Year: 2022).*

(Continued)

*Primary Examiner* — Victoria K. Hall
(74) *Attorney, Agent, or Firm* — Nath, Goldberg & Meyer; Joshua B. Goldberg

(57) ABSTRACT

The present disclosure provides an array substrate including a driving circuit board, and a first electrode layer, an insulating layer, and an anode structure sequentially stacked thereon. The anode structure includes a reflective layer, an intermediate dielectric layer, and a transparent conductive layer sequentially provided in a direction away from the driving circuit board. The array substrate has first, second, and third pixel regions. The anode structure includes first, second, and third anode structures. The first electrode layer includes first, second and third sub-portions. The first, second and third anode structures are coupled with the first, second and third sub-portions through first, second and third (Continued)

via holes in the insulating layer, respectively. A surface of the insulating layer in contact with the first, second and third anode structures is flush; and a thickness of the intermediate dielectric layer in the second, first and third anode structures increases sequentially.

17 Claims, 5 Drawing Sheets

(51) Int. Cl.
*H10K 59/35* (2023.01)
*H10K 50/818* (2023.01)
*H10K 50/852* (2023.01)
*H10K 50/856* (2023.01)
*H10K 59/123* (2023.01)
*H10K 71/00* (2023.01)
*H10K 102/10* (2023.01)

(52) U.S. Cl.
CPC ......... *H10K 50/856* (2023.02); *H10K 59/123* (2023.02); *H10K 71/00* (2023.02); *H10K 2102/102* (2023.02); *H10K 2102/103* (2023.02)

(58) Field of Classification Search
CPC ............ H01L 27/3258; H01L 51/5209; H01L 51/5212; H01L 51/5215; H10K 50/81–818; H10K 50/852; H10K 59/122; H10K 59/124; H10K 59/8051–80518; H10K 59/876

See application file for complete search history.

(56) References Cited

U.S. PATENT DOCUMENTS

| | | | | |
|---|---|---|---|---|
| 2004/0217697 A1* | 11/2004 | Lee | ..................... | H01L 27/3211 313/506 |
| 2005/0067945 A1* | 3/2005 | Nishikawa | .......... | H01L 51/5265 313/506 |
| 2005/0088081 A1* | 4/2005 | Nishikawa | .......... | H01L 51/5265 313/506 |
| 2008/0036705 A1* | 2/2008 | Iwashita | ............. | H01L 27/3244 345/76 |
| 2010/0060148 A1* | 3/2010 | Hwang | ............... | H01L 51/5265 257/E21.532 |
| 2012/0299002 A1* | 11/2012 | Kinoshita | ........... | H01L 51/5265 257/E33.072 |
| 2013/0015460 A1* | 1/2013 | Chen | ................... | H01L 29/7787 257/E21.403 |
| 2014/0167013 A1* | 6/2014 | Lee | ..................... | H01L 51/5265 438/35 |
| 2014/0239272 A1* | 8/2014 | Kim | ..................... | H10K 50/818 257/40 |
| 2015/0187852 A1* | 7/2015 | Isa | ....................... | H01L 27/3248 257/43 |
| 2016/0056214 A1* | 2/2016 | Pyo | ..................... | H01L 51/5265 438/35 |
| 2016/0211479 A1* | 7/2016 | Kobayashi | .......... | H01L 51/5271 |
| 2016/0233309 A1* | 8/2016 | Miyamoto | ........ | H01L 29/66969 |
| 2016/0247870 A1* | 8/2016 | Park | ..................... | H01L 51/5234 |
| 2016/0351155 A1* | 12/2016 | Park | ..................... | G09G 3/3696 |
| 2018/0097049 A1* | 4/2018 | Choi | .................. | H01L 51/5206 |
| 2018/0122954 A1* | 5/2018 | Kim | ........................ | H01L 29/45 |
| 2019/0165317 A1* | 5/2019 | Lai | ..................... | H01L 51/5234 |
| 2019/0189701 A1* | 6/2019 | Bang | ................ | G02F 1/133526 |
| 2019/0237701 A1* | 8/2019 | Chen | .................... | H01L 27/124 |
| 2020/0136095 A1* | 4/2020 | Ju | ........................ | H01L 51/5036 |
| 2021/0028243 A1* | 1/2021 | Yang | ................... | H01L 27/3206 |
| 2021/0111236 A1* | 4/2021 | Yoon | .................. | H01L 27/3246 |
| 2021/0111366 A1* | 4/2021 | Chang | ................ | H01L 27/3258 |
| 2021/0199972 A1* | 7/2021 | Jou | ..................... | H01L 51/5212 |
| 2022/0255042 A1* | 8/2022 | Naruse | ................ | H10K 50/856 |

FOREIGN PATENT DOCUMENTS

| | | | | |
|---|---|---|---|---|
| CN | 105552083 A | | 5/2016 | |
| CN | 109285970 A | | 1/2019 | |
| CN | 110649075 A | | 1/2020 | |
| KR | 10-2012-0139799 A | * | 12/2012 | ......... H01L 51/5203 |

OTHER PUBLICATIONS

International Searching Authority, Written Opinion of International Searching Authority, International application No. PCT/CN2020/079876, dated Dec. 16, 2020, all pages. (Year: 2020).*

Machine translation, International Searching Authority, Written Opinion of International Searching Authority, International application No. PCT/CN2020/079876, dated Dec. 16, 2020, all pages. (Year: 2020).*

International Searching Authority, International Search Report, International application No. PCT/CN2020/079876, dated Dec. 16, 2020, all pages. (Year: 2020).*

Machine translation, Naruse, Japanese Pat. App. No. JP 2019-195526, translation date: Jan. 31, 2023, all pages. (Year: 2023).*

Naruse, Japanese Pat. App. No. JP 2019-195526, filed Oct. 28, 2019. (Year: 2019).*

Office Action dated Jun. 28, 2022 issued in corresponding Chinese Application No. 202080000301.8.

* cited by examiner

ARRAY SUBSTRATE, FABRICATING METHOD THEREFOR AND DISPLAY PANEL

This is a National Phase Application filed under 35 U.S.C. 371 as a national stage of PCT/CN2020/079876, filed on Mar. 18, 2020, the entire contents of which are hereby incorporated by reference.

TECHNICAL FIELD

Embodiments of the present disclosure belong to the field of display technology, and particularly, relate to an array substrate, a method for fabricating the array substrate, and a display panel.

BACKGROUND

As novel display panels, Organic Light-Emitting Diodes (OLED) display panels have been widely used in apparatuses, such as smart watches, mobile phones, tablet computers, and computer displays.

The OLED display panel includes a light-emitting device. The light-emitting device includes a light-emitting functional layer, and the Full Width Half Maximum (FWHM) of a material of the light-emitting functional layer is usually large and is generally not smaller than 100 nm. Due to the non-uniform spreading effect of the sideband vibration and transition of the material of the light-emitting functional layer, the light-emitting performance of the light-emitting device is influenced, and the blue light is influenced most greatly, followed by the red light.

SUMMARY

Embodiments of the present disclosure provide an array substrate, a method for fabricating the array substrate, and a display panel.

In a first aspect, embodiments of the present disclosure provide an array substrate, including a driving circuit board, and a first electrode layer, an insulating layer, and an anode structure, which are sequentially stacked on the driving circuit board; the anode structure includes a reflective layer, an intermediate dielectric layer, and a transparent conductive layer, which are sequentially provided in a direction away from the driving circuit board. The array substrate has a first pixel region, a second pixel region, and a third pixel region; the anode structure includes a first anode structure in the first pixel region, a second anode structure in the second pixel region, and a third anode structure in the third pixel region; the first electrode layer includes a first sub-portion in the first pixel region, a second sub-portion in the second pixel region, and a third sub-portion in the third pixel region; the first anode structure is coupled with the first sub-portion through a first via hole provided in the insulating layer, the second anode structure is coupled with the second sub-portion through a second via hole provided in the insulating layer, and the third anode structure is coupled with the third sub-portion through a third via hole provided in the insulating layer; and the first sub-portion, the second sub-portion, and the third sub-portion are coupled with pixel circuits in the driving circuit board through via holes, respectively. A surface of the insulating layer that is in contact with the first anode structure, the second anode structure, and the third anode structure is flush; and a thickness of the intermediate dielectric layer in the second anode structure, a thickness of the intermediate dielectric layer in the first anode structure, and a thickness of the intermediate dielectric layer in the third anode structure increases in sequence.

In some embodiments, in each of the first anode structure, the second anode structure and the third anode structure, a first side surface of the reflective layer is in contact with and attached to the insulating layer, the intermediate dielectric layer covers all outer side surfaces of the reflective layer except the first side surface, and a peripheral edge region of the intermediate dielectric layer is in contact with and attached to the insulating layer; and the transparent conductive layer covers a whole outer side of the intermediate dielectric layer away from the reflective layer, and a peripheral edge region of the transparent conductive layer is in contact with and attached to the insulating layer.

In some embodiments, surfaces of the first sub-portion, the second sub-portion and the third sub-portion away from the driving circuit board are flush; the first via hole in the insulating layer has one end coupled to a portion, which is in contact with the insulating layer, of the transparent conductive layer in the first anode structure, and another end coupled to the surface of the first sub-portion away from the driving circuit board; the second via hole in the insulating layer has one end coupled to a portion, which is in contact with the insulating layer, of the transparent conductive layer in the second anode structure, and another end coupled to the surface of the second sub-portion away from the driving circuit board; and the third via hole in the insulating layer has one end coupled to a portion, which is in contact with the insulating layer, of the transparent conductive layer in the third anode structure, and another end coupled to the surface of the third sub-portion away from the driving circuit board.

In some embodiments, in each of the first anode structure, the second anode structure, and the third anode structure, an orthogonal projection of the reflective layer on the driving circuit board is within an orthogonal projection of the transparent conductive layer on the driving circuit board.

In some embodiments, the thickness of the intermediate dielectric layer in the second anode structure is in a range from 500 Å to 2000 Å, the thickness of the intermediate dielectric layer in the first anode structure is in a range from 1000 Å to 2500 Å, and the thickness of the intermediate dielectric layer in the third anode structure is in a range from 1500 Å to 3000 Å.

In some embodiments, the reflective layer includes a first metal layer, and a material of the first metal layer includes aluminum.

In some embodiments, the reflective layer further includes a first protective layer on a side of the first metal layer away from the transparent conductive layer.

In some embodiments, the first protective layer includes at least one of a first sub-protective layer and a second sub-protective layer, the first sub-protective layer and the second sub-protective layer are sequentially stacked in a direction away from the first metal layer; and a material of the first sub-protective layer includes titanium, and a material of the second sub-protective layer includes titanium nitride.

In some embodiments, the first metal layer has a thickness from 300 Å to 700 Å, and the first protective layer has a thickness from 50 Å to 200 Å.

In some embodiments, the transparent conductive layer has a thickness from 100 Å to 2000 Å.

In some embodiments, the first via hole, the second via hole, and the third via hole are filled with tungsten.

In some embodiments, the first electrode layer includes a second metal layer, and a material of the second metal layer includes aluminum.

In some embodiments, the first electrode layer further includes a second protective layer on a side of the second metal layer away from the anode structure.

In some embodiments, the first electrode layer further includes a third protective layer on a side of the second metal layer close to the anode structure.

In some embodiments, the second protective layer includes at least one of a first sub-protective layer and a second sub-protective layer; the third protective layer includes at least one of a first sub-protective layer and a second sub-protective layer; the first sub-protective layer and the second sub-protective layer of each of the second protective layer and the third protective layer are sequentially stacked in a direction away from the second metal layer; and a material of the first sub-protective layer of each of the second protective layer and the third protective layer includes titanium, and a material of the second sub-protective layer of each of the second protective layer and the third protective layer includes titanium nitride.

In some embodiments, the intermediate dielectric layer is made of an inorganic insulating material.

In some embodiments, the insulating layer is made of an inorganic insulating material.

In some embodiments, the transparent conductive layer is made of indium tin oxide.

In a second aspect, embodiments of the present disclosure provide a display panel, including any of the above array substrates, and further including a light-emitting functional layer, a cathode layer, and an encapsulation layer sequentially provided on the array substrate. The light-emitting functional layer includes a red light-emitting functional layer, a green light-emitting functional layer, and a blue light-emitting functional layer, which are provided in the first pixel region, the second pixel region and the third pixel region of the array substrate, respectively. The cathode layer is configured to extend over and cover the red light-emitting functional layer, the green light-emitting functional layer, and the blue light-emitting functional layer.

In a third aspect, embodiments of the present disclosure provide a method for fabricating an array substrate having a first pixel region, a second pixel region and a third pixel region, including: fabricating a driving circuit board; and fabricating a first electrode layer, an insulating layer, and an anode structure sequentially on the driving circuit board. Fabricating the anode structure includes fabricating a first anode structure, a second anode structure and a third anode structure in the first pixel region, the second pixel region and the third pixel region of the array substrate, respectively, a surface of the insulating layer that is in contact with the first anode structure, the second anode structure and the third anode structure being flush. Fabricating the first anode structure, the second anode structure and the third anode structure includes fabricating a reflective layer, an intermediate dielectric layer and a transparent conductive layer sequentially on the driving circuit board. Fabricating the first electrode layer includes fabricating a first sub-portion, a second sub-portion and a third sub-portion in the first pixel region, the second pixel region and the third pixel region of the array substrate, respectively. Fabricating the insulating layer includes forming a first via hole, a second via hole, and a third via hole in the insulating layer, where the first anode structure and the first sub-portion are coupled through the first via hole formed in the insulating layer, the second anode structure and the second sub-portion are coupled through the second via hole formed in the insulating layer, and the third anode structure and the third sub-portion are coupled through the third via hole formed in the insulating layer. Fabricating the intermediate dielectric layer includes forming the intermediate dielectric layer having a thickness sequentially increased in the second anode structure, the first anode structure, and the third anode structure, respectively.

In some embodiments, forming the intermediate dielectric layer having a thickness sequentially increased in the second anode structure, the first anode structure, and the third anode structure, respectively, includes: depositing an inorganic insulating film layer; coating a photoresist; performing exposure and development to remove the photoresist in areas except the second pixel region, the first pixel region and the third pixel region, and performing etching to remove the inorganic insulating film layer in areas except the second pixel region, the first pixel region and the third pixel region; performing exposure and development to remove the photoresist in the second pixel region, partially keep the photoresist in the first pixel region, and completely keep the photoresist in the third pixel region, and performing etching to thin the inorganic insulating film layer in the second pixel region; performing exposure and development to remove the photoresist in the first pixel region, and partially remove the photoresist in the third pixel region, performing etching to thin the inorganic insulating film layer in the first pixel region and the inorganic insulating film layer in the second pixel region to form a pattern of the intermediate dielectric layer in the second anode structure and the first anode structure; and removing the photoresist in the third pixel region to form a pattern of the intermediate dielectric layer in the third anode structure.

BRIEF DESCRIPTION OF THE DRAWINGS

The accompanying drawings are included to provide a further understanding of the embodiments of the present disclosure, constitute a part of this specification, and serve to explain the principles of the present disclosure together with the embodiments of the present disclosure and not to limit the present disclosure. The above and other features and advantages will become more apparent to those skilled in the art by describing detailed exemplary embodiments with reference to the drawings, in which.

REFERENCE NUMERALS

Figure 1:
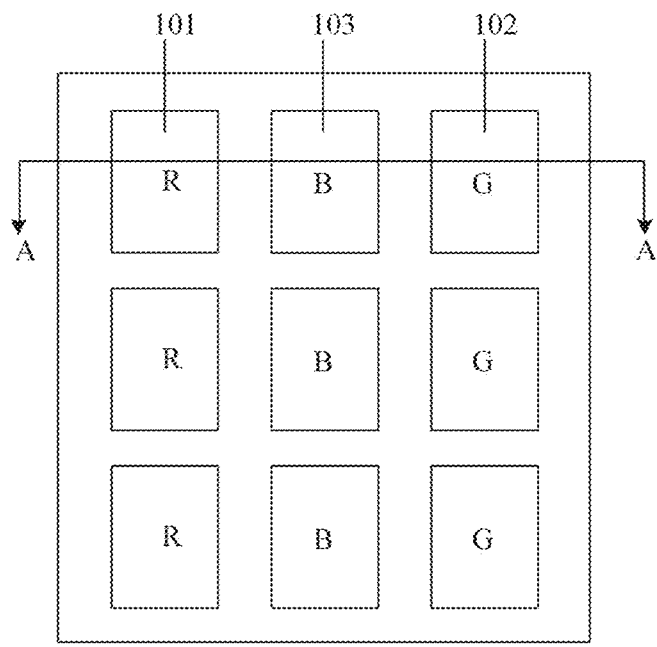
FIG. 1 is a schematic top view of an array substrate in an exemplary embodiment of the present disclosure.

1. a driving circuit board; 2. a first electrode layer; 3. an insulating layer; 31. a first via hole; 32. a second via hole; 33. a third via hole; 4. an anode structure; 41. a reflective layer; 410. a first metal layer; 411. a first protective layer; 412. a fourth protective layer; 42. an intermediate dielectric layer; 43. a transparent conductive layer; 101. a first pixel region; 102. a second pixel region; 103. a third pixel region; 201. a first anode structure; 202. a second anode structure; 203. a third anode structure; 21. a first sub-portion; 22. a second sub-portion; 23. a third sub-portion; 301. a second metal layer; 302. a second protective layer; 303. a third protective layer; 10. a base substrate; 11. a pixel circuit; 11. an active layer; 112. a gate insulating layer; 113. a gate electrode; 114. a first interlayer insulating layer; 115. a source electrode; 116. a drain electrode; 117. a second interlayer insulating layer; 118. an extraction electrode layer; 5. a light-emitting functional layer; 51. a red light-emitting functional layer; 52. a green light-emitting functional layer; 53. a blue light-emitting functional layer; 6. a cathode layer; 7. an encapsulation layer; and 8. a pixel defining layer.

DETAILED DESCRIPTION

In order to make those skilled in the art better understand the technical solutions of the embodiments of the present disclosure, an array substrate, a method for fabricating an array substrate, and a display panel provided in the embodiments of the present disclosure will be described in further detail with reference to the accompanying drawings and the specific embodiments.

Hereinafter, the embodiments of the present disclosure will be more fully described with reference to the accompanying drawings, but the illustrated embodiments may be embodied in different forms and should not be construed as being limited to the embodiments set forth herein. On the contrary, the purpose of providing these embodiments is to make the present disclosure thorough and complete, and to enable those skilled in the art to fully understand the scope of the present disclosure.

The embodiments of the present disclosure are not limited to the embodiments shown in the drawings, but include modifications of configurations formed based on fabricating processes. Thus, the regions illustrated in the drawings have schematic properties, and the shapes of the regions shown in the drawings illustrate specific shapes of the regions, but are not intended to be limiting.

In order to solve the problem that the light-emitting performance of the light-emitting device is affected due to the non-uniform spreading effect of the sideband vibration and transition of the material of the light-emitting functional layer in the OLED light-emitting device, the exemplary embodiments of the present disclosure provide an array substrate, a method for fabricating the array substrate, and a display panel.

Figure 2:
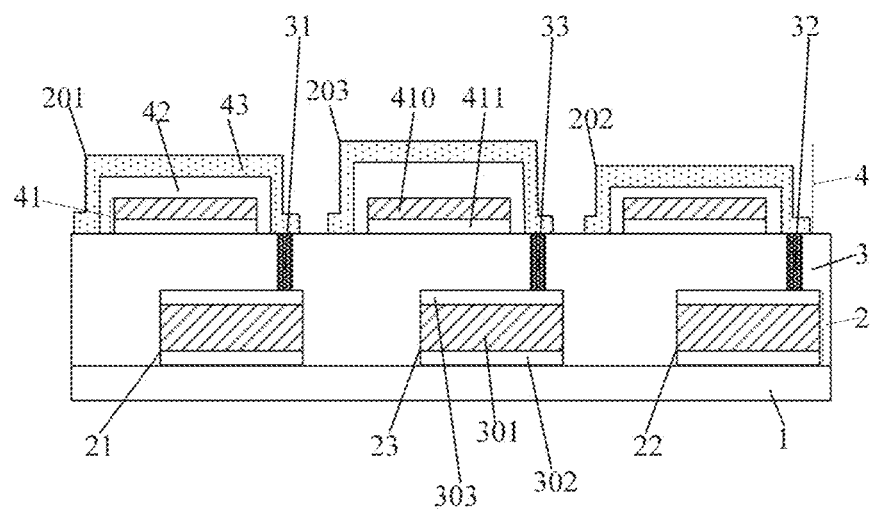
FIG. 2 is a cross-sectional view of the array substrate of FIG. 1 taken along a cross-sectional line A-A.

An exemplary embodiment of the present disclosure provides an array substrate, as shown in FIGS. 1 and 2, including a driving circuit board 1, and a first electrode layer 2, an insulating layer 3, and an anode structure 4, which are sequentially stacked on the driving circuit board 1. The anode structure 4 includes a reflective layer 41, an intermediate dielectric layer 42, and a transparent conductive layer 43, which are sequentially provided in a direction away from the driving circuit board 1. The array substrate is provided with a first pixel region 101, a second pixel region 102, and a third pixel region 103, and the anode structure 4 includes a first anode structure 201, a second anode structure 202, and a third anode structure 203, which are provided in the first pixel region 101, the second pixel region 102, and the third pixel region 103, respectively. The first electrode layer 2 includes a first sub-portion 21, a second sub-portion 22, and a third sub-portion 23, which are provided in the first pixel region 101, the second pixel region 102, and the third pixel region 103, respectively. The first anode structure 201 is coupled with the first sub-portion 21 through a first via hole 31 provided in the insulating layer 3, the second anode structure 202 is coupled with the second sub-portion 22 through a second via hole 32 provided in the insulating layer 3, and the third anode structure 203 is coupled with the third sub-portion 23 through a third via hole 33 provided in the insulating layer 3. The first sub-portion 21, the second sub-portion 22, and the third sub-portion 23 are coupled with the pixel circuits in the driving circuit board 1 through via holes, respectively. A surface of the insulating layer 3 that is in contact with the first anode structure 201, the second anode structure 202, and the third anode structure 203 is flush, and a thickness of the intermediate dielectric layer 42 in the second anode structure 202, a thickness of the intermediate dielectric layer 42 in the first anode structure 201, and a thickness of the intermediate dielectric layer 42 in the third anode structure 203 increases in sequence.

A light-emitting functional layer and a cathode layer are sequentially provided on a side of the anode structure 4 away from the driving circuit board 1. The light-emitting functional layer includes a red light-emitting functional layer, a green light-emitting functional layer and a blue light-emitting functional layer, and the red light-emitting functional layer, the green light-emitting functional layer and the blue light-emitting functional layer are provided in the first pixel region 101, the second pixel region 102 and the third pixel region 103, respectively. In the first pixel region 101, the first anode structure 201, the red light-emitting functional layer and the cathode layer constitute a red light-emitting device; in the second pixel region 102, the second anode structure 202, the green light-emitting functional layer and the cathode layer constitute a green light-emitting device; and in the third pixel region 103, the third anode structure 203, the blue light-emitting functional layer, and the cathode layer constitute a blue light-emitting device.

By providing the first anode structure 201, the second anode structure 202 and the third anode structure 203 on the flush surface of the insulating layer 3, and sequentially increasing the thickness of the intermediate dielectric layer 42 in the second anode structure 202, the first anode structure 201 and the third anode structure 203, the lengths of the microcavities in the light-emitting devices with different colors can be adjusted by adjusting the thickness of the intermediate dielectric layer 42, so that the FWHMs of the emission spectra of the light-emitting devices with different colors are changed, where the larger the length of the microcavity is, the narrower the FWHM of the emission spectrum is. On the basis of the adjustment, the length of the microcavity of the blue light-emitting device can be maximized, followed by the length of the microcavity of the red light-emitting device, and the length of the microcavity of the green light-emitting device is minimum among them, thereby avoiding the influence on the light-emitting performance of the light-emitting device caused by the large FWHMs of the light-emitting devices with different colors and the non-uniform spreading effect of the sideband vibration and transition. As a result, the light-emitting performance of the light-emitting devices with different colors is improved, the light emitted by the light-emitting devices with different colors is more uniform, and the display quality of a display panel adopting the array substrate is improved.

In an embodiment, in each of the first anode structure 201, the second anode structure 202 and the third anode structure 203, a first side surface of the reflective layer 41 is in contact with and attached to the insulating layer 3, the intermediate dielectric layer 42 covers all outer side surfaces except the first side surface of the reflective layer 41, and the peripheral edge region of the intermediate dielectric layer 42 is in contact with and attached to the insulating layer 3. The transparent conductive layer 43 covers the whole outer side of the intermediate dielectric layer 42 away from the reflective layer 41, and the peripheral edge region of the transparent conductive layer 43 is in contact with and attached to the insulating layer 3.

Further, in an embodiment, surfaces of the first sub-portion 21, the second sub-portion 22 and the third sub-portion 23 away from the driving circuit board 1 are flush. The first via hole 31 in the insulating layer 3 has one end coupled to a portion, which is in contact with the insulating layer 3, of the transparent conductive layer 43 in the first anode structure 201, and the other end coupled to the surface of the first sub-portion 21 away from the driving circuit board 1. The second via hole 32 in the insulating layer 3 has one end coupled to a portion, which is in contact with the insulating layer 3, of the transparent conductive layer 43 in the second anode structure 202, and the other end coupled to the surface of the second sub-portion 22 away from the driving circuit board 1. The third via hole 33 in the insulating layer 3 has one end coupled to a portion, which is in contact with the insulating layer 3, of the transparent conductive layer 43 in the third anode structure 203, and the other end coupled to the surface of the third sub-portion 23 away from the driving circuit board 1. In the existing art, the first electrode layer including the first sub-portion, the second sub-portion and the third sub-portion is designed to be coupled to the reflective layer in the anode structure through the opening in the insulating layer, and then the reflective layer is coupled to the transparent conductive layer through the via hole provided in the intermediate dielectric layer. The process of forming the via hole in the intermediate dielectric layer is complex and difficult, because the thickness of the intermediate dielectric layer is different in different sub-pixel regions with different colors. The above structure in the present embodiment enables the depths of the first via hole 31, the second via hole 32, and the third via hole 33 in the insulating layer 3 to be the same, thereby simplifying the process of fabricating the first via hole 31, the second via hole 32, and the third via hole 33, and reducing the difficulty in fabricating the first via hole 31, the second via hole 32, and the third via hole 33.

In an embodiment, the thickness of the intermediate dielectric layer 42 in the second anode structure 202 is in a range from 500 Å to 2000 Å, the thickness of the intermediate dielectric layer 42 in the first anode structure 201 is in a range from 1000 Å to 2500 Å, and the thickness of the intermediate dielectric layer 42 in the third anode structure 203 is in a range from 1500 Å to 3000 Å.

In an embodiment, the intermediate dielectric layer 42 may be made of an inorganic insulating material, such as silicon oxide, silicon nitride, or the like. The inorganic insulating material has better effects of preventing moisture and oxygen from penetrating therethrough, thereby providing better protection for preventing moisture and oxygen from invading the light-emitting device. In addition, the intermediate dielectric layer 42 may be made of an organic insulating material.

In an embodiment, the insulating layer 3 may be made of an inorganic insulating material, such as silicon oxide, silicon nitride, or the like. The inorganic insulating material has better effects of preventing moisture and oxygen from penetrating therethrough, thereby providing better protection for preventing moisture and oxygen from invading the light-emitting device. In addition, the insulating layer 3 may be made of an organic insulating material.

Figure 3:
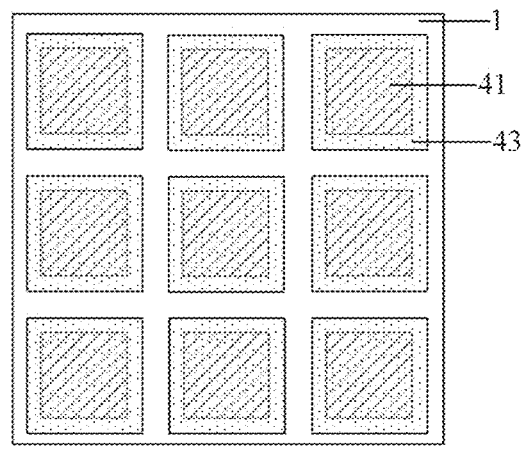
FIG. 3 is a schematic view of orthographic projections of the reflective layer and the transparent conductive layer in each anode structure on the driving circuit board in an exemplary embodiment of the present disclosure.

In some embodiments, as shown in FIG. 3, in each of the first anode structure, the second anode structure, and the third anode structure, an orthogonal projection of the reflective layer 41 on the driving circuit board 1 is within an orthogonal projection of the transparent conductive layer 43 corresponding thereto on the driving circuit board 1. In this way, light emitted from the light-emitting functional layer towards the driving circuit board 1 can be reflected by the reflective layer 41 corresponding to the transparent conductive layer 43. Moreover, the cathode layer is a light transmission layer, and light emitted by the light-emitting functional layer towards the cathode layer is transmitted, so that the top-emission type light-emitting device is realized.

In some embodiments, the orthographic projection of the reflective layer 41 on the driving circuit board 1 being within the orthographic projection of the transparent conductive layer 43 corresponding thereto on the driving circuit board 1 includes: the orthographic projection of the reflective layer 41 on the driving circuit board 1 coincides with the orthographic projection of the transparent conductive layer 43 corresponding thereto on the driving circuit board 1; alternatively, the orthographic projection of the reflective layer 41 on the driving circuit board 1 is within the orthographic projection of the transparent conductive layer 43 corresponding thereto on the driving circuit board 1, and the area of the orthographic projection of the reflective layer 41 on the driving circuit board 1 is smaller than the area of the orthographic projection of the transparent conductive layer 43 corresponding thereto on the driving circuit board 1.

In some embodiments, the shapes of the reflective layer 41 and the transparent conductive layer 43 in each of the first anode structure, the second anode structure, and the third anode structure are not limited and may be designed variously. The shapes of the orthographic projections of the reflective layer 41 and the transparent conductive layer 43 corresponding thereto on the driving circuit board 1 may be the same or different.

Figure 4:
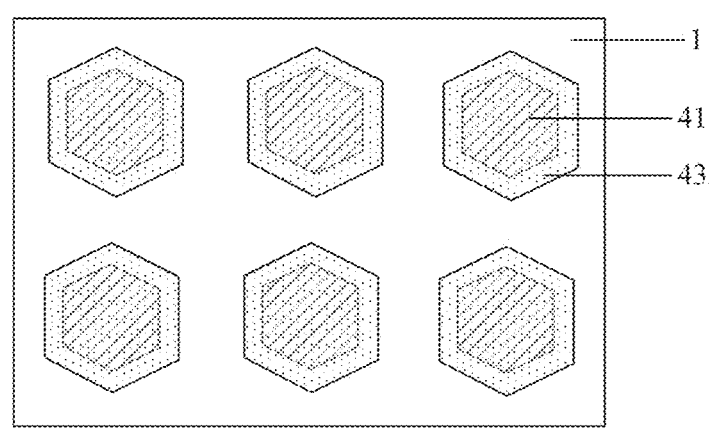
FIG. 4 is another schematic diagram of orthographic projections of the reflective layer and the transparent conductive layer in each anode structure on the driving circuit board in an exemplary embodiment of the present disclosure.

In an embodiment, as shown in FIG. 3, the shapes of the reflective layer 41 and the transparent conductive layer 43 in each of the first anode structure, the second anode structure and the third anode structure are both rectangular; alternatively, as shown in FIG. 4, the shapes of the reflective layer 41 and the transparent conductive layer in each of the first anode structure, the second anode structure, and the third anode structure are both hexagonal.

Further, in an embodiment, the reflective layer 41 includes a first metal layer 410, and the material of the first metal layer 410 includes aluminum. Since aluminum has a very high reflectivity to light, the material of the first metal layer 410 including aluminum can improve display brightness without changing current.

In some embodiments, the reflective layer 41 further includes a first protective layer 411 on a side of the first metal layer 410 away from the transparent conductive layer 43.

In some embodiments, the material of the first protective layer 411 is not limited as long as the first protective layer 411 can be used for protecting the first metal layer 410 from being oxidized.

In some embodiments, the first metal layer 410 has a thickness from 300 Å to 700 Å and the first protective layer 411 has a thickness from 50 Å to 200 Å.

In some embodiments, the first protective layer 411 includes a first sub-protective layer and/or a second sub-protective layer. The first sub-protective layer and the second sub-protective layer are sequentially stacked in a direction away from the first metal layer 410. The material of the first sub-protective layer includes titanium, and the material of the second sub-protective layer includes titanium nitride. By providing the first protective layer 411 on the side of the first metal layer 410 away from the transparent conductive layer 43, moisture and oxygen can be prevented from entering the first metal layer 410 from the side of the first metal layer 410 away from the transparent conductive layer 43, thereby preventing the first metal layer 410 from being oxidized.

Figure 5:
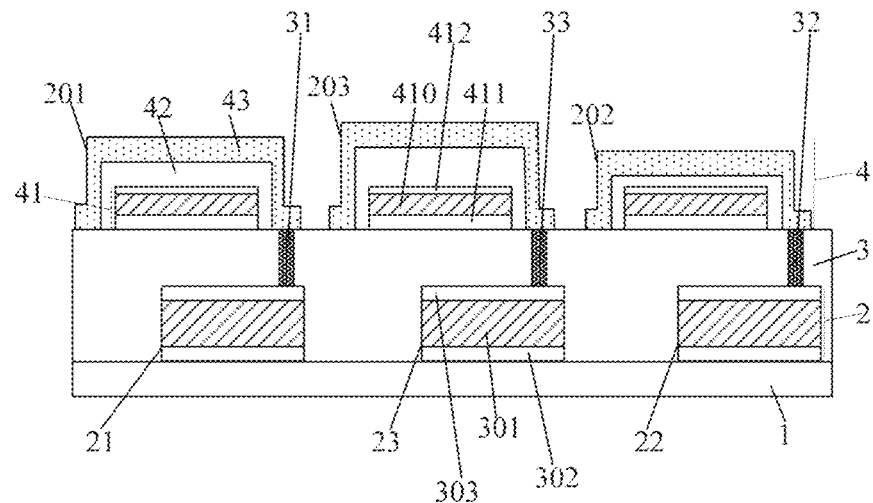
FIG. 5 is a structural cross-sectional view of another array substrate in an exemplary embodiment of the present disclosure.

In an embodiment, as shown in FIG. 5, the reflective layer 41 may further include a fourth protective layer 412 on a side of the first metal layer 410 close to the transparent conductive layer 43. The fourth protective layer 412 includes a first sub-protective layer and/or a second sub-protective layer, and the first sub-protective layer and the second sub-protective layer are sequentially stacked in a direction away from the first metal layer 410. The material of the first sub-protective layer includes titanium, and the material of the second sub-protective layer includes titanium nitride.

In some embodiments, the thickness of the fourth protective layer 412 is not limited and may be designed variously. For example, the thickness of the fourth protective layer 412 may be from 0 to 200 nm. By providing the fourth protective layer 412 on the side of the first metal layer 410 close to the transparent conductive layer 43, moisture and oxygen can be prevented from entering the first metal layer 410 from the side of first metal layer 410 close to the transparent conductive layer 43, thereby preventing the first metal layer 410 from being oxidized.

In some embodiments, the transparent conductive layer 43 has a thickness from 100 Å to 2000 Å. The material of the transparent conductive layer 43 may be a transparent conductive oxide material. For example, the material of the transparent conductive layer 43 may be indium tin oxide (ITO).

In some embodiments, the first via hole 31, the second via hole 32, and the third via hole 33 are filled with tungsten. Since tungsten has no influence on the contact resistance of aluminum, the via holes may be filled with tungsten, and the first, second and third sub-portions 21, 22 and 23 of the first electrode layer 2 are electrically coupled to the transparent conductive layer 43 in the corresponding first, second and third anode structures 201, 202 and 203, respectively, through the tungsten in the via holes.

In some embodiments, the orthographic projection of the via hole on the driving circuit board 1 may be a circle, and the diameter of the circle is greater than 0 nm and less than or equal to 500 nm. The size and shape of the via hole is not limited as long as the first electrode layer 2 can be electrically coupled with the transparent conductive layer 43 in its corresponding anode structure 4 sufficiently.

In some embodiments, as shown in FIG. 2, the first electrode layer 2 includes a second metal layer 301, and the material of the second metal layer 301 includes aluminum. The aluminum is light in weight and good in conductivity, and the conductivity of the first electrode layer 2 can be greatly improved.

In some embodiments, the first electrode layer 2 further includes a second protective layer 302 on a side of the second metal layer 301 away from the anode structure 4. Further, in an embodiment, the first electrode layer 2 further includes a third protective layer 303 on a side of the second metal layer 301 close to the anode structure 4.

In some embodiments, the second protective layer 302 includes a first sub-protective layer and/or a second sub-protective layer; the third protective layer 303 includes a first sub-protective layer and/or a second sub-protective layer; the first sub-protective layer and the second sub-protective layer of each of the second protective layer 302 and the third protective layer 303 are sequentially stacked in a direction away from the second metal layer 301; the material of the first sub-protective layer of each of the second protective layer 302 and the third protective layer 303 includes titanium, and the material of the second sub-protective layer of each of the second protective layer 302 and the third protective layer 303 includes titanium nitride.

By providing the second protective layer 302 on the side of the second metal layer 301 away from the anode structure 4, moisture and oxygen can be prevented from entering the second metal layer 301 from the side of the second metal layer 301 away from the anode structure 4, thereby preventing the second metal layer 301 from being oxidized. By providing the third protective layer 303 on the side of the second metal layer 301 close to the anode structure 4, moisture and oxygen can be prevented from entering the second metal layer 301 from the side of the second metal layer 301 close to the anode structure 4, thereby preventing the second metal layer 301 from being oxidized.

Figure 6:
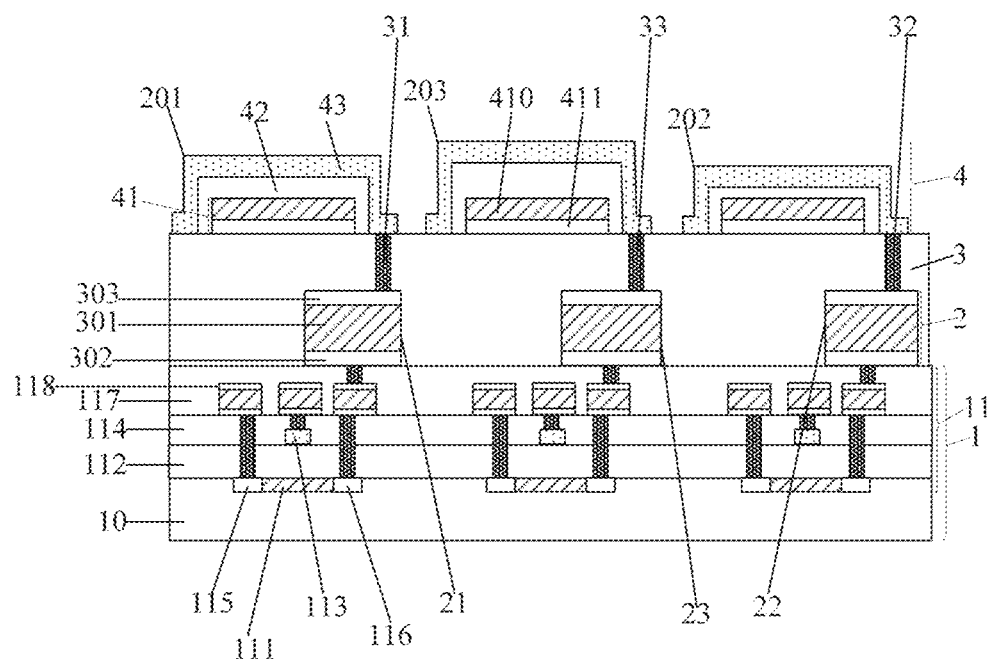
FIG. 6 is a structural cross-sectional view of still another array substrate in an exemplary embodiment of the present disclosure.

In addition, in some embodiments, as shown in FIG. 6, the driving circuit board 1 includes a base substrate 10 and a pixel circuit 11 disposed between the base substrate and the first electrode layer 2. The pixel circuit 11 is configured to drive the light-emitting device to emit light. The pixel circuit 11 at least includes a switching transistor, a driving transistor, and a storage capacitor.

Here, taking the pixel circuit of 2T1C as an example, the pixel circuit at least includes one switching transistor, one driving transistor, and one storage capacitor. The source electrode of the switching transistor is coupled to the data signal terminal, and the drain electrode of the switching transistor is coupled to the gate electrode 113 of the driving transistor and one end of the storage capacitor. The source electrode 115 of the driving transistor is coupled to a VDD signal line or signal terminal, the drain electrode 116 of the driving transistor is coupled to the other end of the storage capacitor and the first electrode layer 2, and the first electrode layer 2 is coupled to the transparent conductive layer 43 of the anode structure 4. The cathode layer of the light-emitting device is coupled to a VSS signal line or signal terminal.

Each of the switching transistor and the driving transistor may be one of a bottom gate type silicon-based transistor, a top gate type silicon-based transistor and a double gate type silicon-based transistor.

Taking a top gate type silicon-based transistor as an example, the base substrate is a silicon substrate; each of the switching transistor and the driving transistor includes an active layer 111 as a portion of the silicon substrate, a source electrode 115 and a drain electrode 116 at opposite sides of the active layer 111, a gate insulating layer 112, a gate electrode 113, a first interlayer insulating layer 114, an extraction electrode layer 118, and a second interlayer insulating layer 117. The extraction electrode layer 118 includes a plurality of sub-portions provided at intervals, and the sub-portions are coupled to the source electrode 115, the gate electrode 113, and the drain electrode 116 through tungsten holes, respectively, so as to introduce signals to the source electrode 115 and the gate electrode 113 and extract signals output from the drain electrode 116. In addition, the sub-portion coupled to the drain electrode 116 is further coupled to the sub-portions of the first electrode layer 2 through a tungsten hole to provide a driving signal to the anode structure.

The gate electrode 113 is made of a polysilicon material; the active layer 111 is formed by doping the silicon substrate; the source electrode 115 and the drain electrode 116 are formed by heavily doping the silicon substrate; and each of the gate insulating layer 112, the first interlayer insulating layer 114, and the second interlayer insulating layer 117 is made of silicon oxide, silicon oxynitride, or silicon nitride.

In some embodiments, the material of the base substrate 10 is not limited, and for example, the material of the base substrate 10 may be polyimide, glass, or the like. In addition, the switching transistor and the driving transistor may be thin film transistors.

In the array substrate provided in the exemplary embodiment, by providing the first anode structure, the second anode structure and the third anode structure on the flush surface of the insulating layer, and sequentially increasing the thickness of the intermediate dielectric layer in the second anode structure, the first anode structure and the third anode structure, the lengths of the microcavities in the light-emitting devices with different colors can be adjusted by adjusting the thickness of the intermediate dielectric layer, so that the FWHMs of the emission spectra of the light-emitting devices with different colors are changed, where the larger the length of the microcavity is, the narrower the FWHM of the emission spectrum is. On the basis of the adjustment, the length of the microcavity of the blue light-emitting device can be maximized, followed by the length of the microcavity of the red light-emitting device, and the length of the microcavity of the green light-emitting device is minimum among them, thereby avoiding the influence on the light-emitting performance of the light-emitting device caused by the large FWHMs of the light-emitting devices with different colors and the non-uniform spreading effect of the sideband vibration and transition. As a result, the light-emitting performance of the light-emitting devices with different colors is improved, the light emitted by the light-emitting devices with different colors is more uniform, and the display quality of a display panel adopting the array substrate is improved.

Based on the structure of the array substrate in the above exemplary embodiment, another exemplary embodiment of the present disclosure provides a method for fabricating the array substrate, where the array substrate has a first pixel region, a second pixel region, and a third pixel region, and the method includes: fabricating a driving circuit board.

The method further includes fabricating a first electrode layer, an insulating layer and an anode structure sequentially on the driving circuit board.

The fabrication of the anode structure includes fabricating a first anode structure, a second anode structure and a third anode structure in the first pixel region, the second pixel region and the third pixel region of the array substrate, respectively, where a surface of the insulating layer that is in contact with the first anode structure, the second anode structure and the third anode structure is flush, and the fabrication of each of the first anode structure, the second anode structure and the third anode structure includes fabricating a reflective layer, an intermediate dielectric layer and a transparent conductive layer sequentially on the driving circuit board.

The fabrication of the first electrode layer includes fabricating a first sub-portion, a second sub-portion and a third sub-portion in the first pixel region, the second pixel region and the third pixel region of the array substrate, respectively.

The fabrication of the insulating layer includes forming a first via hole, a second via hole, and a third via hole therein. The first anode structure and the first sub-portion are coupled through the first via hole formed in the insulating layer, the second anode structure and the second sub-portion are coupled through the second via hole formed in the insulating layer, and the third anode structure and the third sub-portion are coupled through the third via hole formed in the insulating layer.

The fabrication of the intermediate dielectric layer includes forming the intermediate dielectric layer having a thickness sequentially increased in the second anode structure, the first anode structure, and the third anode structure, respectively.

Figure 8:
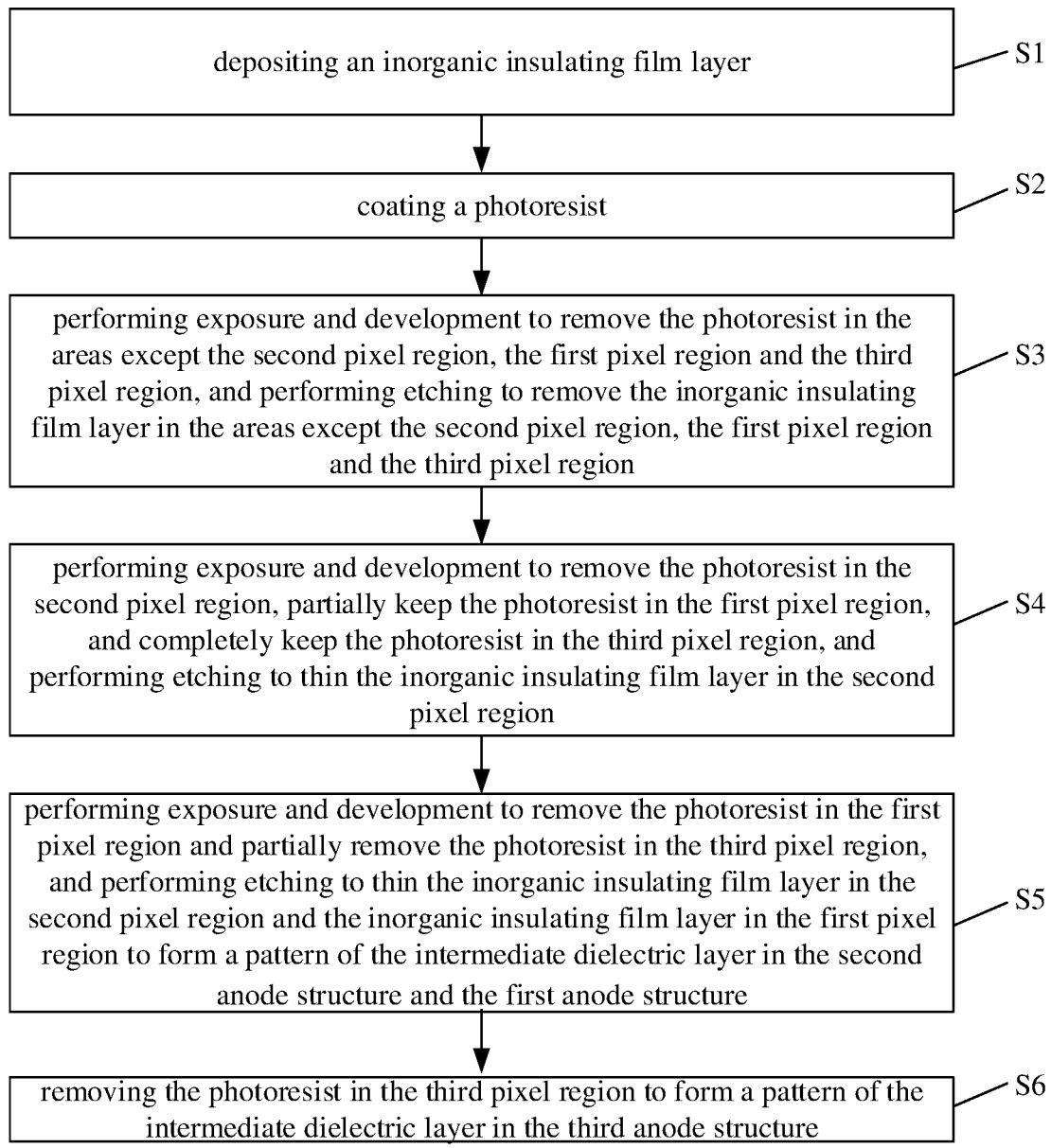
FIG. 8 is a flowchart showing formation of the intermediate dielectric layer in an exemplary embodiment of the present disclosure.

In some embodiments, as shown in FIG. 8, forming the intermediate dielectric layer having a thickness sequentially increased in the second anode structure, the first anode structure, and the third anode structure, respectively, includes:

Step S1: depositing an inorganic insulating film layer;
Step S2: coating photoresist;
Step S3: performing exposure and development to remove the photoresist in the areas except the second pixel region, the first pixel region and the third pixel region, and performing etching to remove the inorganic insulating film layer in the areas except the second pixel region, the first pixel region and the third pixel region:
Step S4: performing exposure and development to remove the photoresist in the second pixel region, partially keep the photoresist in the first pixel region, and completely keep the photoresist in the third pixel region, and performing etching to thin the inorganic insulating film layer in the second pixel region;
Step S5: performing exposure and development to remove the photoresist in the first pixel region and partially remove the photoresist in the third pixel region, and performing etching to thin the inorganic insulating film layer in the second pixel region and the inorganic insulating film layer in the first pixel region to form a pattern of the intermediate dielectric layer in the second anode structure and the first anode structure; and
Step S6: removing the photoresist in the third pixel region to form a pattern of the intermediate dielectric layer in the third anode structure.

In some embodiments, the intermediate dielectric layer is made of a photosensitive organic insulating material, and the intermediate dielectric layer having the sequentially increasing thickness in the second anode structure, the first anode structure and the third anode structure can be formed by film coating, exposure and development.

In some embodiments, in a case where the insulating layer is made of an inorganic insulating material, the insulating layer and the first via hole, the second via hole and the third via hole in the insulating layer may be fabricated by deposition, exposure, development and etching; and in a case where the insulating layer is made of a photosensitive organic insulating layer material, the insulating layer and the first via hole, the second via hole and the third via hole in the insulating layer may be fabricated by film coating, exposure and development.

In some embodiments, the active layer, the source electrode and the drain electrode of the silicon-based transistor in the driving circuit board are fabricated by a doping process, and the gate electrode of the silicon-based transistor is formed by an excimer laser annealing method to convert the gate electrode of the amorphous silicon material into the gate electrode of the polysilicon material. Other film layers of the silicon-based transistor and film layers of the storage capacitor in the driving circuit board are fabricated by adopting a conventional patterning process (including the process steps of film forming, photoresist coating, exposure, development, etching, and the like). Each film layer of the thin film transistor in the driving circuit board is fabricated by adopting a conventional patterning process (including process steps of film forming, photoresist coating, exposure, development, etching, and the like), details of which are not repeated herein.

In some embodiments, each film layer in the first electrode layer, the reflective layer and the transparent conductive layer in the anode structure, and the cathode layer are fabricated by adopting a conventional patterning process (including process steps of film forming, photoresist coating, exposure, development, etching, and the like), details of which are not repeated herein.

In some embodiments, the light-emitting functional layer is fabricated by adopting an evaporation process, details of which will not be described herein.

Figure 7:
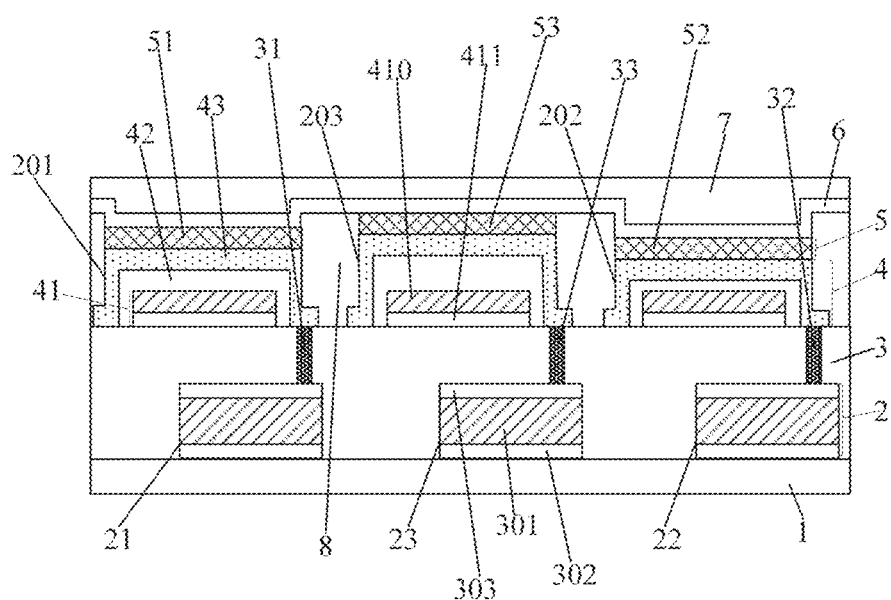
FIG. 7 is a structural cross-sectional view of a display panel in an exemplary embodiment of the present disclosure.

Another exemplary embodiment of the present disclosure provides a display panel. As shown in FIG. 7, the display panel includes the array substrate in the any of the above embodiments, and further includes a light-emitting functional layer 5, a cathode layer 6 and an encapsulation layer 7 sequentially provided on the array substrate. The light-emitting functional layer 5 includes a red light-emitting functional layer 51, a green light-emitting functional layer 52 and a blue light-emitting functional layer 53 which are provided in the first pixel region, the second pixel region and the third pixel region of the array substrate, respectively. The cathode layer 6 extends over and covers the red light-emitting functional layer 51, the green light-emitting functional layer 52, and the blue light-emitting functional layer 53.

In the first pixel region, the first anode structure 201, the red light-emitting functional layer 51 and the cathode layer 6 constitute a red light-emitting device; in the second pixel region, the second anode structure 202, the green light-emitting functional layer 52 and the cathode layer 6 constitute a green light-emitting device; and in the third pixel region, the third anode structure 203, the blue light-emitting functional layer 53 and the cathode layer 6 constitute a blue light-emitting device.

In some embodiments, a pixel defining layer 8 is further provided between the red light-emitting device, the green light-emitting device and the blue light-emitting device, and the pixel defining layer 8 can prevent light crosstalk between light-emitting devices with different colors, so that a display effect of the display panel is improved.

By adopting the array substrate in the above embodiments, the display panel provided in the present exemplary embodiment can improve the light-emitting performance of the light-emitting devices with different colors, so that the light emitted by the light-emitting devices with different colors is more uniform, thereby improving the display quality of the display panel. Moreover, by adopting the array substrate in the above embodiments, the process of fabricating the display panel can be simplified, and the difficulty in fabricating the display panel is reduced.

The display panel provided by the exemplary embodiment of the present disclosure may be any product or component having a display function, such as an OLED panel, an OLED television, a display, a mobile phone, and a navigator.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. An array substrate, comprising a driving circuit board, and a first electrode layer, an insulating layer, and an anode structure sequentially stacked on the driving circuit board; the anode structure comprising a reflective layer, an intermediate dielectric layer, and a transparent conductive layer sequentially provided in a direction away from the driving circuit board, wherein the array substrate has a first pixel region, a second pixel region, and a third pixel region; the anode structure comprises a first anode structure in the first pixel region, a second anode structure in the second pixel region, and a third anode structure in the third pixel region; the first electrode layer comprises a first sub-portion in the first pixel region, a second sub-portion in the second pixel region, and a third sub-portion in the third pixel region; the first anode structure is coupled with the first sub-portion through a first via hole provided in the insulating layer, the second anode structure is coupled with the second sub-portion through a second via hole provided in the insulating layer, and the third anode structure is coupled with the third sub-portion through a third via hole provided in the insulating layer; and the first sub-portion, the second sub-portion, and the third sub-portion are coupled with pixel circuits in the driving circuit board through via holes, respectively, wherein the first via hole, the second via hole, and the third via hole are filled with tungsten;

a surface of the insulating layer that is in contact with the first anode structure, the second anode structure, and the third anode structure is flush; and a thickness of the intermediate dielectric layer in the second anode structure, a thickness of the intermediate dielectric layer in the first anode structure, and a thickness of the intermediate dielectric layer in the third anode structure increases in sequence, wherein in each of the first anode structure, the second anode structure and the third anode structure, a first side surface of the reflective layer is in contact with and attached to the insulating layer, the intermediate dielectric layer covers all outer side surfaces of the reflective layer except the first side surface, and a peripheral edge region of the intermediate dielectric layer is in contact with and attached to the insulating layer; and the transparent conductive layer covers a whole outer side of the intermediate dielectric layer away from the reflective layer, and a peripheral edge region of the transparent conductive layer is in contact with and attached to the insulating layer.

2. The array substrate of claim 1, wherein surfaces of the first sub-portion, the second sub-portion and the third sub-portion away from the driving circuit board are flush;
the first via hole in the insulating layer has one end coupled to a portion, which is in contact with the insulating layer, of the transparent conductive layer in the first anode structure, and another end coupled to the surface of the first sub-portion away from the driving circuit board;
the second via hole in the insulating layer has one end coupled to a portion, which is in contact with the insulating layer, of the transparent conductive layer in the second anode structure, and another end coupled to the surface of the second sub-portion away from the driving circuit board; and
the third via hole in the insulating layer has one end coupled to a portion, which is in contact with the insulating layer, of the transparent conductive layer in the third anode structure, and another end coupled to the surface of the third sub-portion away from the driving circuit board.

3. The array substrate of claim 1, wherein in each of the first anode structure, the second anode structure, and the third anode structure, an orthogonal projection of the reflective layer on the driving circuit board is within an orthogonal projection of the transparent conductive layer on the driving circuit board.

4. The array substrate of claim 1, wherein the thickness of the intermediate dielectric layer in the second anode structure is in a range from 500 Å to 2000 Å, the thickness of the intermediate dielectric layer in the first anode structure is in a range from 1000 Å to 2500 Å, and the thickness of the intermediate dielectric layer in the third anode structure is in a range from 1500 Å to 3000 Å.

5. The array substrate of claim 1, wherein the reflective layer comprises a first metal layer, and a material of the first metal layer comprises aluminum.

6. The array substrate of claim 5, wherein the reflective layer further comprises a first protective layer on a side of the first metal layer away from the transparent conductive layer.

7. The array substrate of claim 6, wherein the first protective layer comprises a first sub-protective layer and a second sub-protective layer, and the first sub-protective layer and the second sub-protective layer are sequentially stacked in a direction away from the first metal layer; and
a material of the first sub-protective layer comprises titanium, and a material of the second sub-protective layer comprises titanium nitride.

8. The array substrate of claim 7, wherein the first metal layer has a thickness from 300 Å to 700 Å, and the first protective layer has a thickness from 50 Å to 200 Å.

9. The array substrate of claim 1, wherein the transparent conductive layer has a thickness from 100 Å to 2000 Å.

10. The array substrate of claim 1, wherein the first electrode layer comprises a second metal layer, and a material of the second metal layer comprises aluminum.

11. The array substrate of claim 10, wherein the first electrode layer further comprises a second protective layer on a side of the second metal layer away from the anode structure.

12. The array substrate of claim 11, wherein the first electrode layer further comprises a third protective layer on a side of the second metal layer close to the anode structure.

13. The array substrate of claim 12, wherein the second protective layer comprises a first sub-protective layer and a second sub-protective layer; the third protective layer comprises a first sub-protective layer and a second sub-protective layer; the first sub-protective layer and the second sub-protective layer of each of the second protective layer and the third protective layer are sequentially stacked in a direction away from the second metal layer; and
a material of the first sub-protective layer of each of the second protective layer and the third protective layer comprises titanium, and a material of the second sub-protective layer of each of the second protective layer and the third protective layer comprises titanium nitride.

14. The array substrate of claim 1, wherein at least one of the intermediate dielectric layer and the insulating layer is made of an inorganic insulating material.

15. The array substrate of claim 1, wherein the transparent conductive layer is made of indium tin oxide.

16. A display panel, comprising the array substrate according to claim 1, and further comprising a light-emitting functional layer, a cathode layer, and an encapsulation layer sequentially provided on the array substrate; wherein
the light-emitting functional layer comprises a red light-emitting functional layer, a green light-emitting functional layer, and a blue light-emitting functional layer, which are provided in the first pixel region, the second pixel region and the third pixel region of the array substrate, respectively; and
the cathode layer is configured to extend over and cover the red light-emitting functional layer, the green light-emitting functional layer, and the blue light-emitting functional layer.

17. A method for fabricating an array substrate having a first pixel region, a second pixel region and a third pixel region, comprising:
fabricating a driving circuit board; and
fabricating a first electrode layer, an insulating layer, and an anode structure sequentially on the driving circuit board,
wherein fabricating the anode structure comprises fabricating a first anode structure, a second anode structure and a third anode structure in the first pixel region, the second pixel region and the third pixel region of the array substrate, respectively, a surface of the insulating layer that is in contact with the first anode structure, the second anode structure and the third anode structure being flush, and fabricating the first anode structure, the second anode structure and the third anode structure comprises fabricating a reflective layer, an intermediate dielectric layer and a transparent conductive layer sequentially on the driving circuit board;
fabricating the first electrode layer comprises fabricating a first sub-portion, a second sub-portion and a third sub-portion in the first pixel region, the second pixel region and the third pixel region of the array substrate, respectively;
fabricating the insulating layer comprises forming a first via hole, a second via hole, and a third via hole in the insulating layer, wherein the first anode structure and the first sub-portion are coupled through the first via hole formed in the insulating layer, the second anode structure and the second sub-portion are coupled through the second via hole formed in the insulating layer, and the third anode structure and the third sub-portion are coupled through the third via hole formed in the insulating layer; and fabricating the intermediate dielectric layer comprises forming the intermediate dielectric layer having a thickness sequentially increased in the second anode structure, the first anode structure, and the third anode structure, respectively, wherein forming the intermediate dielectric layer having a thickness sequentially increased in the second anode structure, the first anode structure, and the third anode structure, respectively, comprises:

depositing an inorganic insulating film layer;

coating a photoresist;

performing exposure and development to remove the photoresist in areas except the second pixel region, the first pixel region and the third pixel region, and performing etching to remove the inorganic insulating film layer in areas except the second pixel region, the first pixel region and the third pixel region;

performing exposure and development to remove the photoresist in the second pixel region, partially keep the photoresist in the first pixel region, and completely keep the photoresist in the third pixel region, and performing etching to thin the inorganic insulating film layer in the second pixel region;

performing exposure and development to remove the photoresist in the first pixel region and partially remove the photoresist in the third pixel region, and performing etching to thin the inorganic insulating film layer in the second pixel region and the inorganic insulating film layer in the first pixel region to form a pattern of the intermediate dielectric layer in the second anode structure and the first anode structure; and removing the photoresist in the third pixel region to form a pattern of the intermediate dielectric layer in the third anode structure.

* * * * *